US010978401B2

(12) United States Patent
Lin et al.

(10) Patent No.: US 10,978,401 B2
(45) Date of Patent: Apr. 13, 2021

(54) PACKAGE STRUCTURE

(71) Applicant: Unimicron Technology Corp., Taoyuan (TW)

(72) Inventors: Yi Lin, Taipei (TW); Chun-Ming Chiu, Taoyuan (TW); Hung-Chih Lee, Taoyuan (TW); Chang-Fu Chen, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/000,912

(22) Filed: Jun. 6, 2018

(65) Prior Publication Data

US 2019/0279936 A1    Sep. 12, 2019

(30) Foreign Application Priority Data

Mar. 9, 2018  (TW) .................................. 107108151

(51) Int. Cl.
| | |
|---|---|
| *H01L 23/00* | (2006.01) |
| *H01L 23/538* | (2006.01) |
| *H01L 25/065* | (2006.01) |
| *H01L 21/48* | (2006.01) |

(52) U.S. Cl.
CPC ........ *H01L 23/5386* (2013.01); *H01L 21/486* (2013.01); *H01L 21/4853* (2013.01); *H01L 21/4857* (2013.01); *H01L 23/5385* (2013.01); *H01L 24/17* (2013.01); *H01L 25/0652* (2013.01)

(58) Field of Classification Search
CPC ....................... H01L 23/5386; H01L 23/5385
See application file for complete search history.

(56) References Cited

U.S. PATENT DOCUMENTS

2006/0226527 A1\* 10/2006 Hatano ............... H01L 23/5389
257/686
2008/0315398 A1    12/2008 Lo et al.
2009/0085225 A1    4/2009 Park
2014/0264791 A1    9/2014 Manusharow et al.
(Continued)

FOREIGN PATENT DOCUMENTS

| CN | 101038886 A | 9/2007 |
|---|---|---|
| CN | 100470793 C | 3/2009 |

(Continued)

*Primary Examiner* — Trang Q Tran
(74) *Attorney, Agent, or Firm* — CKC & Partners Co., LLC

(57) ABSTRACT

A package structure includes a first substrate, a second substrate, a plurality of dies, a plurality of first conductive elements, and a plurality of second conductive elements. The first substrate has a recessed region. The second substrate is disposed in the recessed region and protrudes from the first substrate. The dies are disposed on the first substrate and the second substrate, such that the second substrate is disposed between the first substrate and the dies. The first conductive elements are disposed between the dies and the first substrate. The dies are electrically connected with the first substrate through the first conductive elements. The second conductive elements are disposed between the dies and the second substrate. The dies are electrically connected with the second substrate through the second conductive elements.

8 Claims, 8 Drawing Sheets

(56) References Cited

U.S. PATENT DOCUMENTS

| | | | |
|---|---|---|---|
| 2015/0116965 A1* | 4/2015 | Kim | H01L 23/5385 |
| | | | 361/767 |
| 2017/0040264 A1 | 2/2017 | Qian et al. | |
| 2017/0207196 A1* | 7/2017 | Lee | H01L 23/48 |
| 2018/0005945 A1 | 1/2018 | Pietambaram et al. | |
| 2018/0040548 A1 | 2/2018 | Kim et al. | |

FOREIGN PATENT DOCUMENTS

| | | |
|---|---|---|
| CN | 104218016 A | 12/2014 |
| CN | 105762138 A | 7/2016 |
| TW | 201727842 A | 8/2017 |
| WO | 2018175099 A1 | 9/2018 |

* cited by examiner

PACKAGE STRUCTURE

CROSS-REFERENCE TO RELATED APPLICATION

This application claims priority to Taiwan Application Serial Number 107108151, filed Mar. 9, 2018, the disclosure of which is incorporated herein by reference in its entirety.

BACKGROUND

Nowadays, in order to provide a higher density of die-to-die interconnections in a package process, many approaches have been developed, for example, inserting a silicon interposer between dies and substrates, and electrically connecting the dies and the substrates by through-silica vias. However, the silicon interposer has a larger volume and thickness, and also results in problems of high fabrication cost and complicated manufacturing processes.

An embedded multi-die interconnect bridge (EMIB) approach uses embedded dies as a bridge structure. However, when a flip-chip process is used to connect the dies, the density of interconnections is limited because of the flat surface of the substrate, thus lacking the flexibility in adjusting the density of interconnections between the dies.

SUMMARY

One embodiment of the present invention is to provide a package structure.

According to some embodiments of the present invention, a package structure includes a first substrate, a second substrate, plural dies, plural first conductive elements, and plural second conductive elements. The first substrate has a recessed region. The second substrate is disposed in the recessed region and protrudes from the first substrate. The dies are disposed on the first substrate and the second substrate, such that the second substrate is disposed between the first substrate and the dies. The first conductive elements are disposed between the dies and the first substrate. The dies are electrically connected to the first substrate through the first conductive elements. The second conductive elements are disposed between the dies and the second substrate. The dies are electrically connected to the second substrate through the second conductive elements.

In some embodiments of the present invention, a height of the first conductive elements is greater than a height of the second conductive elements.

In some embodiments of the present invention, the package structure further includes a first solder mask layer and a second solder mask layer. The first solder mask layer is at least disposed on the first substrate in the recessed region. The second solder mask is at least disposed on a surface of the second substrate facing the recessed region.

In some embodiments of the present invention, the first solder mask layer has plural first openings, and the second solder mask layer has plural second openings. The package structure further includes plural third conductive elements. The third conductive elements are electrically connected to the first substrate and the second substrate through the first openings and the second openings.

In some embodiments of the present invention, the dies are located at the same horizontal level.

In some embodiments of the present invention, the package structure further includes an underfill layer. The underfill layer surrounds the first conductive elements and the second conductive elements, and covers the first substrate and the second substrate.

In the foregoing embodiments of the present invention, because the first substrate has a recessed region, the second substrate is secured in the recessed region, and the first conductive elements and the second conductive elements are used to electrically connect the dies, the first substrate and the second substrate, the space of signal transformation between the dies through the second substrate can be increased under the same area and volume of the package structure, and the transmission efficiency can be improved by reducing the circuit length.

Another embodiment of the present invention is to provide a package structure.

According to some embodiments of the present invention, a package structure includes a first substrate, plural dies, a second substrate, and plural first conductive elements. The dies are disposed on the first substrate and are adjacent to each other. The dies collectively have a recessed region. The second substrate is disposed in the recessed region and electrically connected to the dies. A surface of the second substrate facing away from the recessed region is substantially flush with surfaces of the dies facing away from the first substrate. The first conductive elements are disposed between the dies and the first substrate. The dies are electrically connected to the first substrate through the first conductive elements.

In some embodiments of the present invention, each of the dies has a circuit structure and conductive vias electrically connected to the circuit structure therein. The package structure further includes plural second conductive elements. The second conductive elements are disposed between the dies and the second substrate. The second substrate is electrically connected to the first substrate through the second conductive elements, the conductive via, the circuit structure and the first conductive elements.

In some embodiments of the present invention, the package structure further includes an underfill layer. The underfill layer surrounds the first conductive elements and covers the first substrate.

In some embodiments of the present invention, there is a gap between the dies, such that the second substrate is exposed through the gap, and the package structure further includes plural third conductive elements. The third conductive elements are disposed between the first substrate and an exposed portion of the second substrate. The second substrate is electrically connected to the first substrate through the third conductive elements.

In some embodiments of the present invention, the package structure further includes an underfill layer. The underfill layer surrounds the first conductive elements and the third conductive elements and covers the first substrate.

In some embodiments of the present invention, a height of the third conductive elements is greater than a height of the first conductive elements.

In the foregoing embodiments of the present invention, because the dies adjacent to each other collectively have the recessed region that is disposed in an inactive region at the back sides of the dies, the second substrate can be disposed in the recessed region to not only provide extra options for traces of the dies but also increase the space of signal transformation between the dies under the same package structure area and volume.

DETAILED DESCRIPTION

Figure 1A:
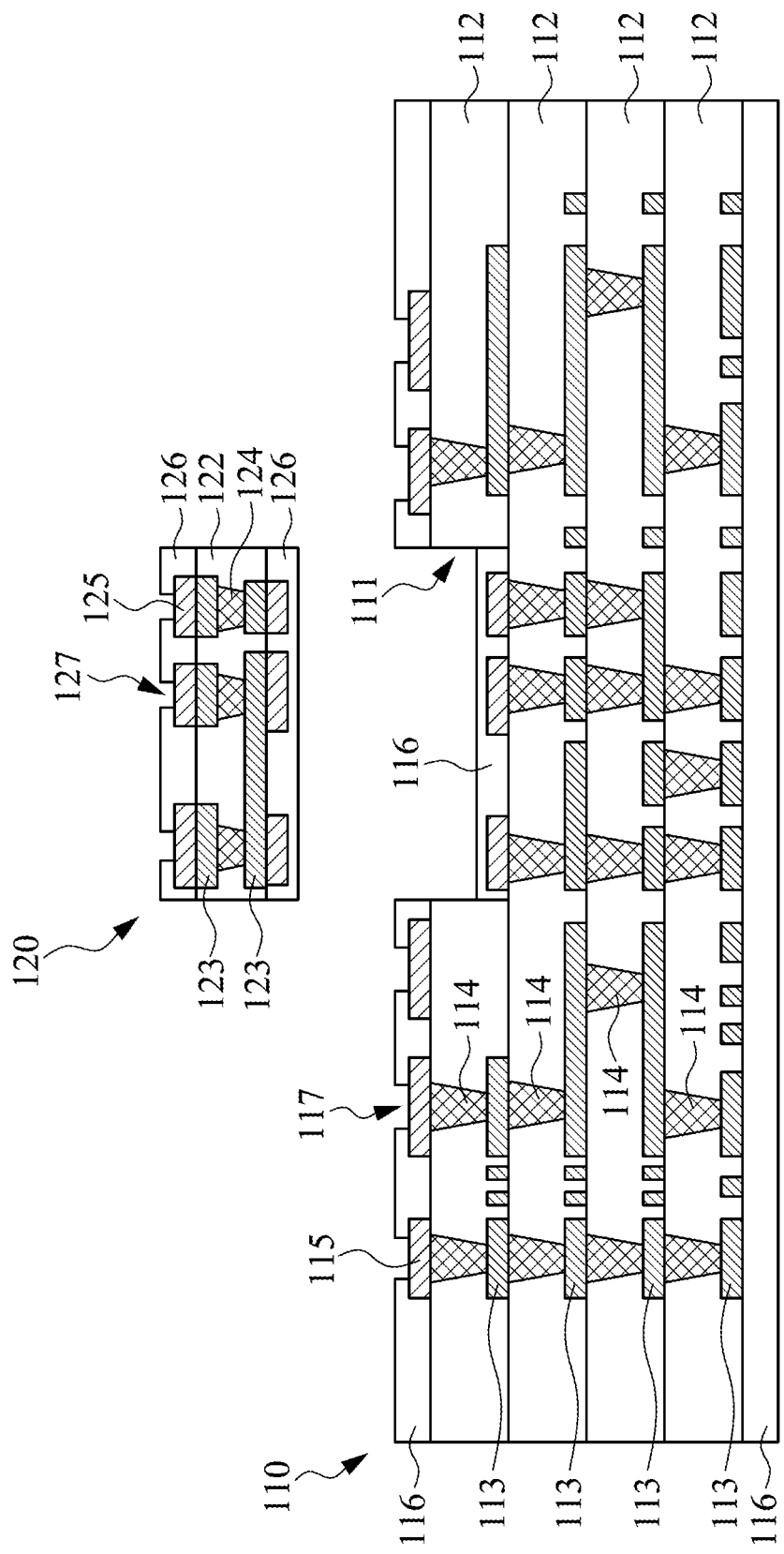
FIG. 1A to FIG. 1C are schematic cross-sectional views of a package structure at different stages in fabrication according to one embodiment of the present disclosure.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact. In addition, the present disclosure may repeat reference numerals and/or letters in the various examples. This repetition does not in itself dictate a relationship between the various embodiments and/or configurations discussed.

Figure 1B:
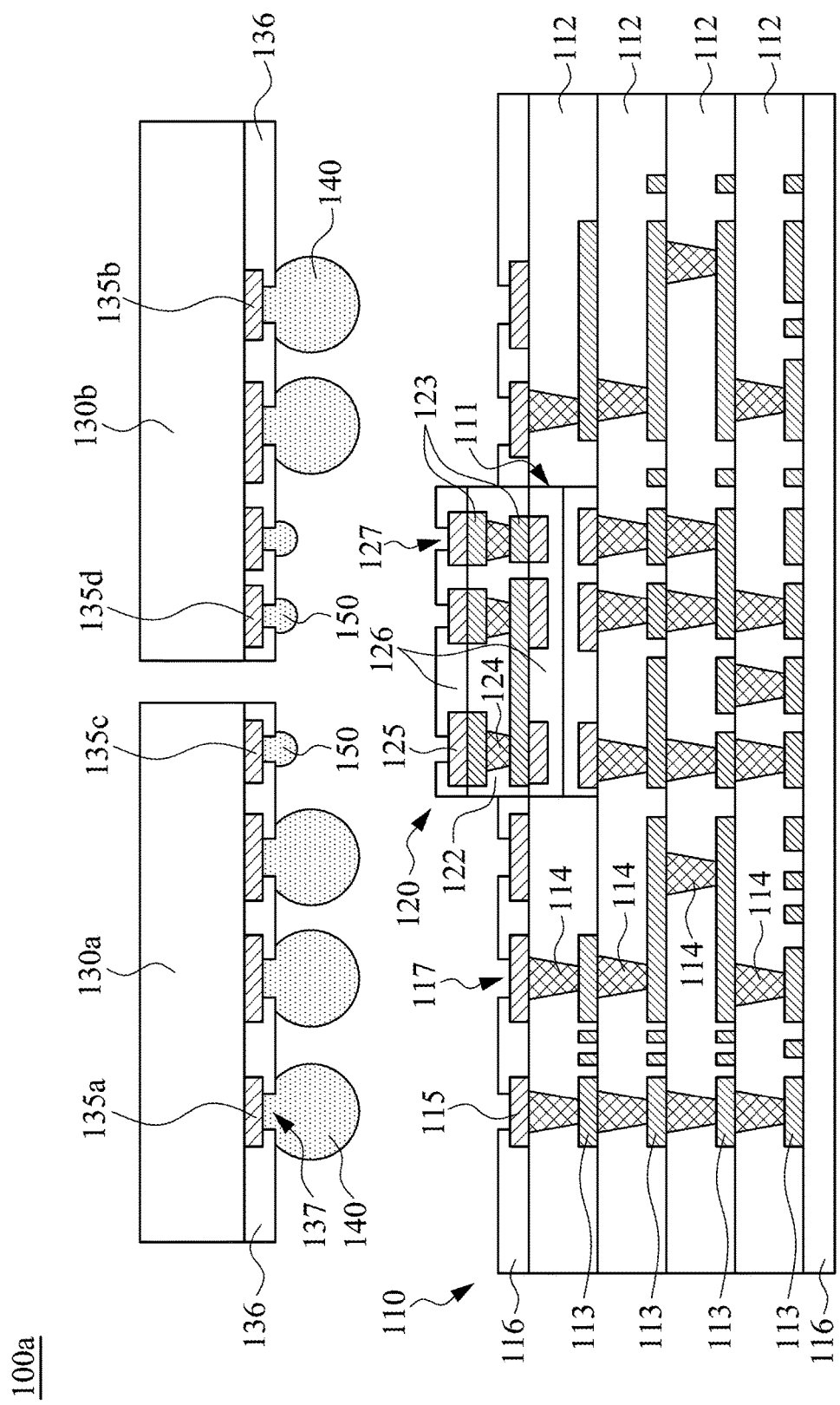
Figure 1C:
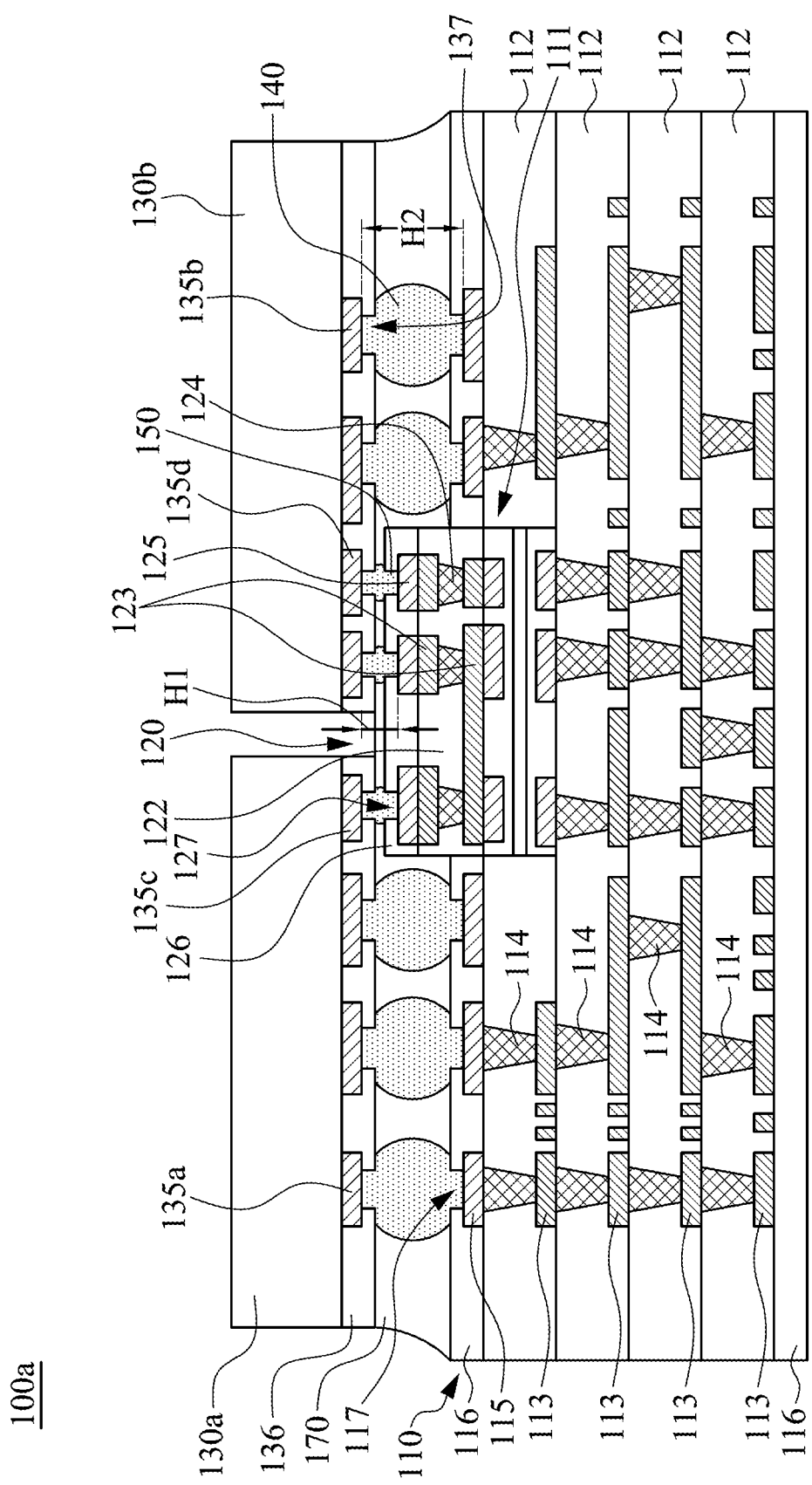

FIG. 1A to FIG. 1C are schematic cross-sectional views of a package structure 100a at different stages in fabrication according to one embodiment of the present disclosure. Reference is made to FIG. 1A, a first substrate 110 has a recessed region 111 configured to receive a second substrate 120. After the second substrate 120 is secured in the recessed region 111 of the first substrate 110, a top surface of the second substrate 120 is higher than a top surface of the first substrate 110. In other words, the second substrate 120 protrudes form the first substrate 110.

The first substrate 110 has dielectric layers 112, circuit layers 113 and conductive vias 114. The circuit layers 113 and the conductive vias 114 are disposed in the dielectric layers 112. The numbers of the aforementioned dielectric layers, circuit layers, and conductive vias do not limit the present disclosure. In the present embodiment, the first substrate 110 further has pads 115 disposed on a top surface of the top layer of the dielectric layers 112. The pads 115 can be electrically connected to the circuit layers 113 through the conductive vias 114. In the present embodiment, the first substrate 110 further has the solder mask layers 116. The solder mask layers 116 are disposed on a top surface and a bottom surface of the first substrate 110, and an inner surface of the recessed region 111. In the present embodiment, the solder mask layer 116 disposed on the top surface of the first substrate 110 further has openings 117, such that a portion of each of the pads 115 is exposed through the opening 117. During the fabrication process, the solder mask layer 116 which covers the pads 115 is formed first, and then the openings 117 are formed by patterning the solder mask layers 116. The pads 115 in the openings 117 can be used for disposing the solder material.

Similarly, the second substrate 120 has a dielectric layer 122, circuit layers 123, and conductive vias 124. The circuit layers 123 and the conductive vias 124 are disposed in the dielectric layer 122. In the present embodiment, the second substrate 120 further has pads 125 and solder mask layers 126 disposed on the dielectric layer 122. The pads 125 are electrically connected to the electrical layers 123 through the conductive vias 124. The solder mask layers 126 are disposed on a top surface and a bottom surface of the second substrate 120. In the present embodiment, the solder mask layer 126 disposed on the top surface of the second substrate 120 further has openings 127, such that a portion of each of the pads 125 is exposed through the openings 127. The pads 125 in the openings 127 can be used for disposing the solder material.

In some embodiments, a total thickness of the second substrate 120 is smaller than 0.1 mm. In some embodiments, a thickness of the recessed region 111 is between about 30 um to about 50 um.

Reference is made to FIG. 1B, the package structure 100a includes a die 130a, a die 130b, a first substrate 110, a second substrate 120, plural first conductive elements 140 and plural second conductive elements 150. After the second substrate 120 is secured in the recessed region 111 of the first substrate 110, the die 130a and the die 130b can be disposed on the first substrate 110 and second substrate 120. In the present embodiment, the die 130a further has pads 135a and pads 135c. The pads 135a and the pads 135c respectively face toward the first substrate 110 and the second substrate 120, and are electrically connected to a circuit layer (not shown) in the die 130a. The die 130b has pads 135b and pads 135d. The pads 135b and the pads 135d respectively face toward the first substrate 110 and the second substrate 120, and are electrically connected to a circuit layer (not shown) in the die 130b. In other words, the pads 135c on the die 130a are located at a side which is adjacent to the die 130b, and the pads 135d on the die 130b are located at a side which is adjacent to the die 130a.

In the present embodiment, the die 130a has the first conductive elements 140 and the second conductive elements 150 which are respectively disposed on the pads 135a and the pads 135c. The die 130b has the first conductive elements 140 and the second conductive elements 150 which are respectively disposed on the pads 135b and the pads 135d. When the die 130a and the die 130b are disposed on the first substrate 110 and the second substrate 120, the first conductive elements 140 of the die 130a and the die 130b can be electrically connected to the first substrate 110, and the second conductive elements 150 of the die 130a and the die 130b can be electrically connected to the second substrate 120. In some embodiments, the first conductive elements 140 and the second conductive elements 150 may be metal bumps. The material of the first conductive elements 140 and the second conductive elements 150 may be tin-lead alloy or copper, and the formation method may include plating, printing or other method, but those methods are not limited in this regard.

In the present embodiment, bottom surfaces of the die 130a and the die 130b have a protection layer 136, and the protection layer 136 has the openings 137, such that a portion of each of the pads 135a, 135b, 135c, and 135d is exposed. The first conductive elements 140 are disposed on the pads 135a and the pads 135b which are located in the openings 137, and the second conductive elements 150 are disposed on the pads 135c and the pads 135d which are located in the openings 137. In some embodiments, a under bump metallurgy (UBM) (not shown) may be disposed on the pads 135a, 135b, 135c, and 135d.

When the die 130a and the die 130b are bonded on the first substrate 110 and the second substrate 120, the first conductive elements 140 and the second conductive elements 150 can be melted as solder bumps during a reflow process. Therefore, the first conductive elements 140 can be electrically connected to the pads 115 on the first substrate 110 and the pads 135a on the die 130a, and electrically connected to the pads 115 on the first substrate 110 and the pads 135b on the die 130b. Furthermore, the second conductive elements 150 can be electrically connected to the pads 125 on the first substrate 120 and the pads 135c on the die 130a, and electrically connected to the pads 125 on the first substrate 120 and the pads 135d on the die 130b.

Reference is made to FIG. 1C, in the present embodiment, after the reflow process, an underfill layer 170 is formed between the die 130a and the first substrate 110/the second substrate 120, and between the die 130b and the first substrate 110/the second substrate 120. The underfill layer 170 covers the first substrate 110 and the second substrate 120, and surrounds the first conductive elements 140 and the second conductive elements 150, thereby increasing the electric connection reliability of the first conductive elements 140 and the second conductive elements 150 and avoiding the short circuit. The package structure 100a can be applied in a die signal integration system. In the present embodiment, the die 130a and the die 130b can either contact each other or be spaced at a gap, but the present invention is not limited thereto.

Moreover, in the present embodiment, since the second substrate 120 protrudes form the top surface of the first substrate 110, a vertical distance H1 between the die 130a/the die 130b and the second substrate 120 is smaller than a vertical distance H2 between the die 130a/the die 130b and the first substrate 110. Therefore, the height of each of the second conductive elements 150 is smaller than the height of each of the first conductive element 140s, and the bonded dies 130a and 130b can be located at the same horizontal level, so as to reduce the stress accumulated on the surfaces of the dies during the package process. Furthermore, since the height of each of the second conductive elements 150 is smaller than the height of each of the first conductive elements 140, the volume of each of the second conductive elements 150 is smaller than the volume of each of the first conductive elements 140, and a gap formed between the adjacent second conductive elements 150 can be smaller. As a result, the density of the second conductive elements 150 on the die 130a and the die 130b can be greater than the density of the first conductive elements 140 on the die 130a and the die 130b, the space of signal transformation between the die 130a and the die 130b through the second substrate 120 can be increased under the same area and volume of the package structure, and the transmission efficiency can be improved by reducing the circuit length.

Figure 1D:
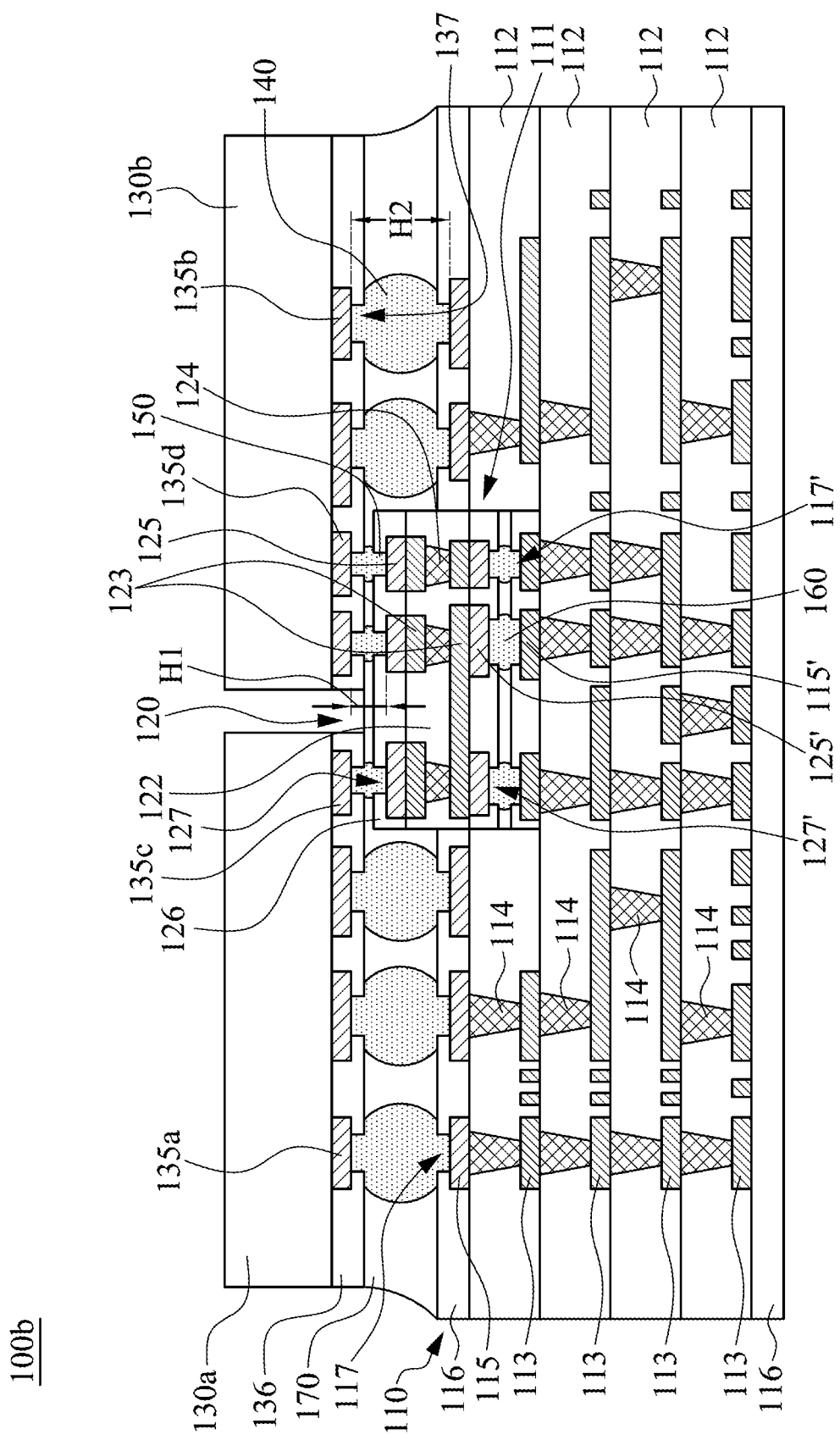
FIG. 1D is a schematic cross-sectional view of a package structure according to another embodiment of the present disclosure.

FIG. 1D is a schematic cross-sectional view of a package structure 100b according to another embodiment of the present disclosure. As shown in the figure, the package structure 100b includes the first substrate 110 having the recessed region 111, the second substrate 120, the die 130a, the die 130b, the first conductive elements 140, and the second conductive elements 150. The difference between the present embodiment and the embodiment in FIG. 1C is that the recessed region 111 of the first substrate 110 of the package structure 100b further has pads 115' facing the second substrate 120. The solder mask layers 116 in the recessed region 111 of the first substrate 110 have openings 127', such that a portion of each of pads 125' is exposed. Furthermore, the third conductive elements 160 are disposed between the pads 115' and the pads 125', thereby electrically connecting the pads 115' to the pads 125'.

In the present embodiment, since the thickness of the third conductive elements 160 causes the height of the top surface of the secured second substrate 120 to be higher than the height of the top surface of the first substrate 110, the interval between the die 130a/the die 130b and the second substrate 120 is smaller than the interval between the die 130a/the die 130b and the first substrate 110. Therefore, the height of each of the second conductive elements 150 is smaller than the height of each of the first conductive elements 140 and may be adjusted according to the height of each of the third conductive elements 160, such that the bonded die 130a, die 130b can be located at the same horizontal level, so as to reduce the stress accumulated on the surfaces of the dies during the package process. In the present embodiment, a designer may adjust the heights of the first conductive elements 140, the second conductive elements 150, and the third conductive elements 160 to enable the die 130a and the die 130b to be located at the same horizontal level, thus having more design flexibility.

Furthermore, in the present embodiment, the electrical connection between the first substrate 110 and the second substrate 120 can increase application space for circuit configuration from the die 130a/the die 130b to the first substrate 110/the second substrate 120, and increase signal integration capability under the same package structure area and volume.

In some embodiments, the third conductive elements 160 may be metal bumps. The material of the third conductive elements 160 may be tin-lead alloy or copper, and the formation method may include plating, printing or other method, but the present disclosure is not limited thereto.

In the following description, a further application of the foregoing embodiments will be explained.

Figure 2A:
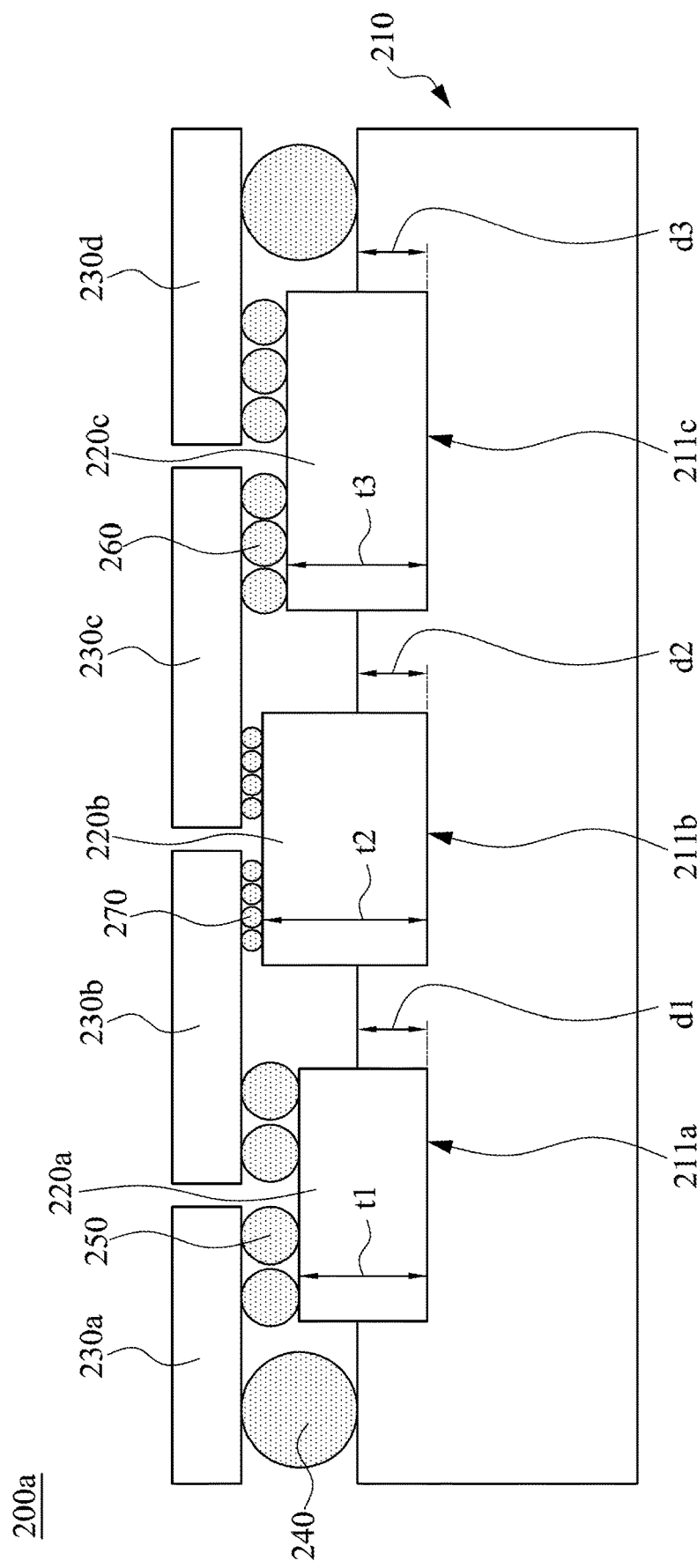
FIG. 2A is a schematic cross-sectional view of a package structure according to another embodiment of the present disclosure.

FIG. 2A is a schematic cross-sectional view of a package structure 200a according to another embodiment of the present disclosure. As shown in the figure, in the present embodiment, a first substrate 210 has plural recessed regions 211a, 211b and 211c that have a depth d1, a depth d2 and a depth d3 respectively, in which d1=d2=d3. The substrates 220a, 220b and 220c have a thickness t1, a thickness t2 and a thickness t3, in which t2>t3>t1. The recessed regions 211a, 211b and 211c are respectively configured to receive the substrates 220a, 220b, and 220c with different thicknesses. The substrate 220a is connected to its overlying adjacent dies 230a and 230b; the substrate 220b is connected to its overlying adjacent dies 230b and 230c; the substrate 220a is connected to its overlying adjacent dies 230c and 230d. By adjusting the heights of the conductive elements 240, 250, 260, and 270 of the package structure 200a, the bonded dies 230a, 230b, 230c, and 230d can be located at the same horizontal level. Since smaller heights of the conductive elements may have smaller volumes, and the intervals between conductive elements can be reduced, thereby increasing the density of the conductive elements, thus increasing the signal transmission density under the same package structure area and volume, and improving the signal integration capability.

Figure 2B:
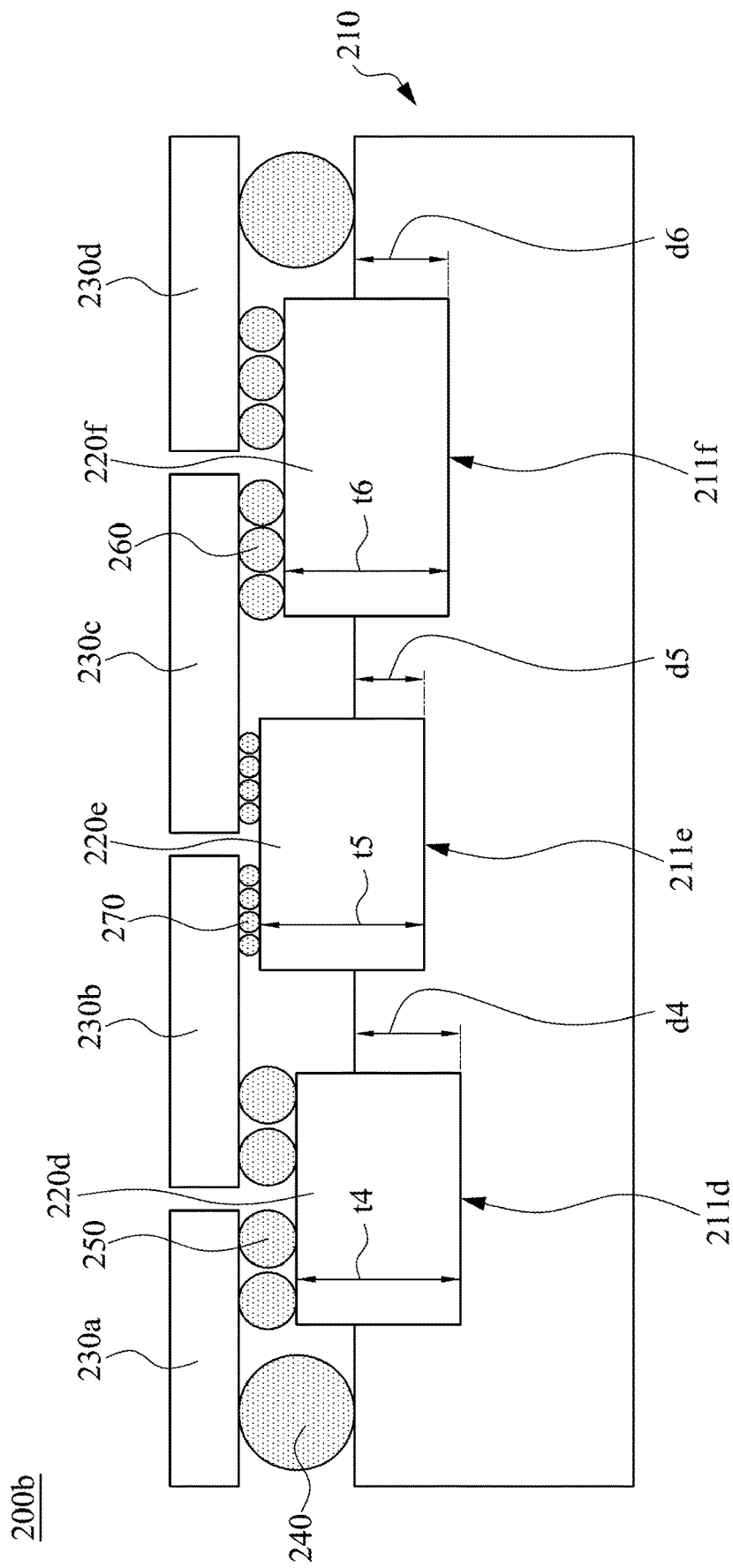
FIG. 2B is a schematic cross-sectional view of a package structure according to another embodiment of the present disclosure.

FIG. 2B is a schematic cross-sectional view of a package structure 200b according to another embodiment of the present disclosure. As shown in the figure, in the present embodiment, the first substrate 210 has plural recessed regions 211d, 211e, and 211f that have a depth d4, a depth d5, and a depth d6 respectively, in which d4>d6>d5. The substrates 220d, 220e and 220f have a thickness t4, a thickness t5, and a thickness t6, in which t4=t5=t6. The recessed regions 211d, 211e, and 211f are respectively configured to receive the substrates with different thickness. The substrate 220d is connected to its overlying adjacent dies 230a and 230b; the substrate 220e is connected to its overlying adjacent dies 230b and 230c; the substrate 220f is connected to its overlying adjacent dies 230c and 230d. By adjusting the heights of the conductive elements 240, 250, 260, and 270 of the package structure 200b, the bonded dies 230a, 230b, 230c, and 230d can be located at the same horizontal level. Since smaller heights of the conductive elements may have smaller volumes, and the intervals between conductive elements can be reduced, thereby increasing the density of the conductive elements, thus increasing the signal transmission density under the same package structure area and volume, and improving the signal integration capability.

Figure 3A:
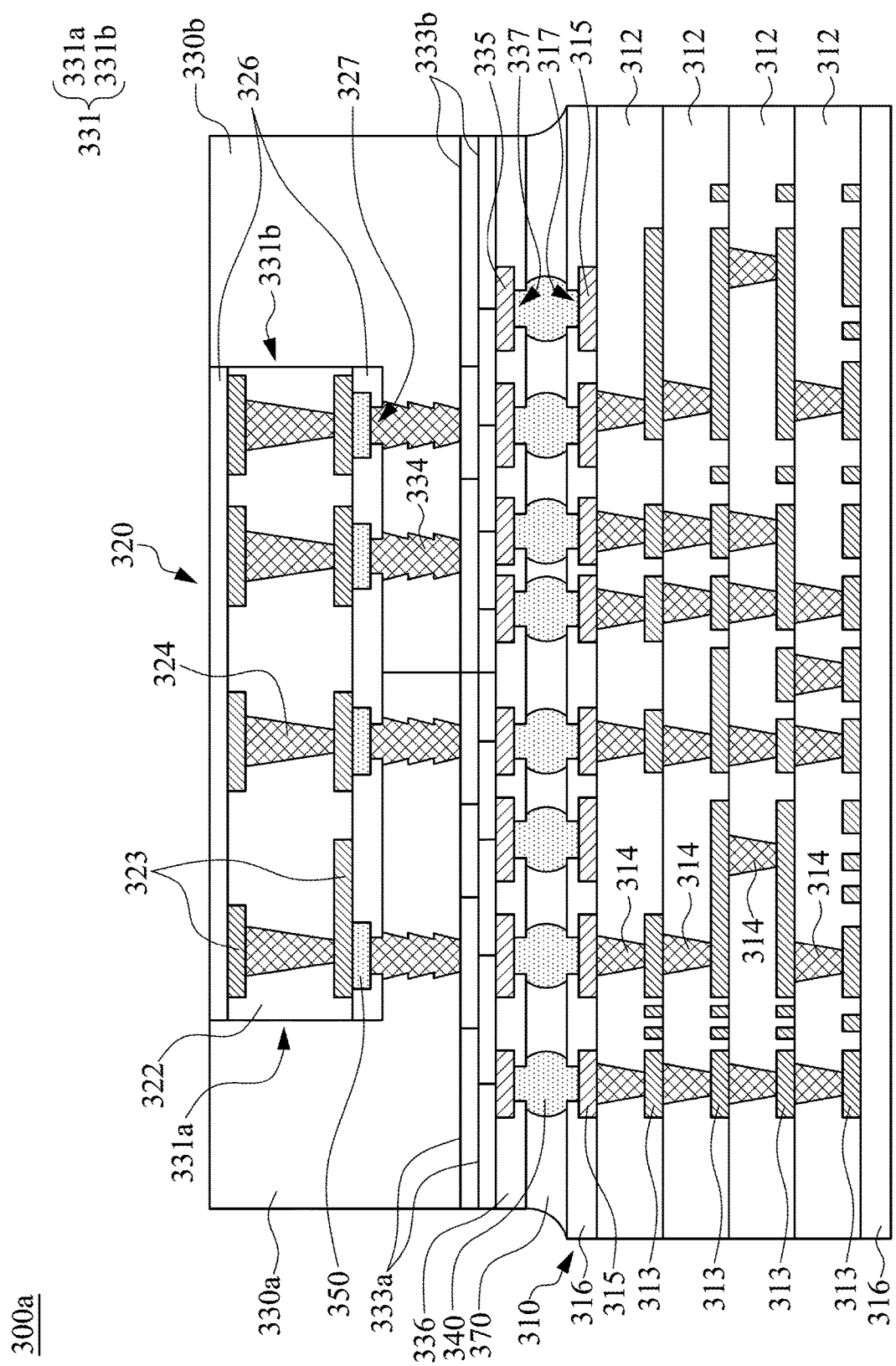
FIG. 3A is a schematic cross-sectional view of a package structure according to another embodiment of the present disclosure.

FIG. 3A is a cross-sectional view of a package structure 300a according to another embodiment of the present disclosure. In the present embodiment, the package structure 300a includes a first substrate 310, a second substrate 320, a die 330a, a die 330b, and plural first conductive elements 340. The first substrate 310 has the dielectric layers 312, the circuit layers 313, and the conductive vias 314. The circuit layers 313 and the conductive vias 314 are disposed in the dielectric layers 312. The numbers of the aforesaid dielectric layers, circuit layers, and conductive vias are not limited in this regard. In the present embodiment, the first substrate 310 further includes the pads 315 disposed on the top layer of the dielectric layers 312. The pads 315 can be electrically connected to the circuit layers 313 through the conductive vias 314. In the present embodiment, the first substrate 310 further has the solder mask layers 316. The solder mask layers 316 are disposed on a top surface and a bottom surface of the first substrate 310. In the present embodiment, the solder mask layers 316 have the openings 317, such that a portion of each of the pads 315 is exposed through the openings 317. During the fabrication process, the part of the solder mask layers 316 which covers the pads 315 is formed first, and then the openings 317 are formed by patterning the solder mask layers 116. The pads 315 within the openings 317 can be used for installing the solder material.

In the present embodiment, a sidewall of the die 330a abuts against a sidewall of the die 330b. The die 330a has a recessed region 331a, the die 330b has a recessed region 331b, such that the recessed region 331a and the recessed region 331b can collectively form a recessed region 331 for installation of the second substrate 320. In the present embodiment, the die 330a has a circuit layer 333a and the conductive vias 334, the dies 330b has a circuit layer 333b and the conductive vias 334. The surfaces of the die 330a and the die 330b facing toward the first substrate 310 further have the pads 335. The surfaces of the die 330a and the die 330b facing toward the first substrate 310 further have a protection layer 336, and the protection layer 336 has the openings 337, such that a portion of each of the pads 335 can be exposed. Furthermore, the first conductive elements 340 are located between the pads 335 and the pads 315 to electrically connect the pads 335 and the pads 315.

In the present embodiment, the second substrate 320 includes dielectric layers 322, the circuit layers 323, and the conductive vias 324. The circuit layers 323 and the conductive vias 324 are disposed in the dielectric layers 322. In the present embodiment, after the second substrate 320 is secured in the recessed region 331, a surface of the second substrate 320 facing away from the recessed region 331 is substantially flush with surfaces of the die 330a and the die 330b facing away from the first substrate 310. Furthermore, a surface of the dielectric layers 322 of the second substrate 320 facing the die 330a and the die 330b further has the second conductive elements 350. The surfaces of the second substrate 320 facing the die 330a and the die 330b have the solder mask layers 326. The solder mask layers 326 have the openings 327, such that a portion of each of the second conductive elements 350 can be exposed. The circuit layers 323 of the second substrate 320 can be electrically connected to the die 330a and the die 330b through the second conductive elements 350 and the conductive vias 324.

In the present embodiment, the package structure 300a further includes an underfill layer 370 disposed between the die 330a, the die 330b, the first substrate 310, and the second substrate 320. The underfill layer 370 covers the first substrate 310 and the second substrate 320 and surrounds the first conductive elements 340, such that the electric connection reliability of the first conductive elements 340 can be increased and the short circuit can be avoided.

In the present embodiment, since the recessed region 331 can be disposed in the useless region at the back side of the die 330a and the die 330b, the second substrate 320 can be disposed in the recessed region 331 to not only provide extra options for the traces of the die 330a and the die 330b but also increase the space of signal transformation between the die 330a and the die 330b under the same package structure area and volume.

In some embodiments, the recessed region 331 can be formed by etching. In some embodiments, the conductive vias 334 can be formed by through-silica vias (TSV). In some embodiments, a total thickness of the second substrate 320 is smaller than 0.1 mm. In some embodiments, the first conductive elements 340 can be metal bumps. The material of the first conductive elements 340 can be tin-lead alloy or copper, and the formation method can include plating, or printing.

Figure 3B:
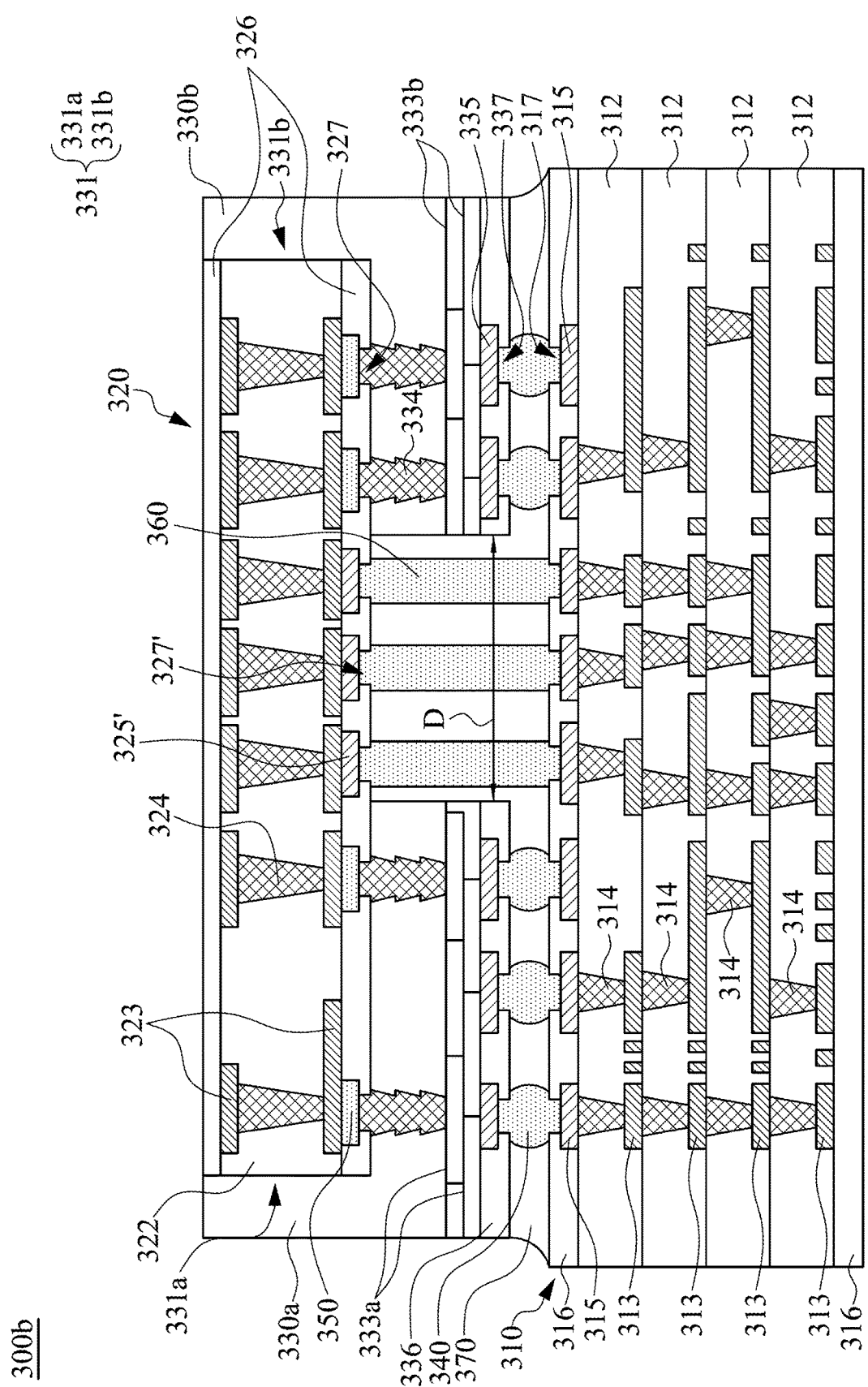
FIG. 3B is a schematic cross-sectional view of a package structure according to another embodiment of the present disclosure.

FIG. 3B is a cross-sectional view of a package structure 300b according to another embodiment of the present disclosure. The package structure 300b includes a first substrate 310, a second substrate 320, a die 330a, a die 330b, plural first conductive elements 340 and plural second conductive elements 350. The difference between the present embodiment and the embodiment in FIG. 3A is that: a gap D is between the die 330a and the die 330b, such that a portion of the second substrate 320 is exposed through the gap D, and the package structure 300b further includes the third conductive elements 360. The third conductive elements 360 are disposed on the portion of the second substrate 320 exposed through the gap D. In the present embodiment, a surface of the dielectric layers 322 of the second substrate 320 facing the die 330a, the die 330b, and the gap D further has pads 325' and solder mask layers 326. The solder mask layers 326 have the openings 327, such that a portion of each of the pads 325' is exposed through the openings 317. Furthermore, the third conductive elements 360 are disposed between the pads 325' and the pads 315 to electrically connect the pads 325' and the pads 315. In the present embodiment, the underfill layer 370 is disposed between the die 330a, the die 330b, and the first substrate 310, and between the portion of the second substrate 320 exposed through the gap D and the first substrate 310. The underfill layer 370 covers the first substrate 310 and the second substrate 320 and the portion of the second substrate 320 exposed through the gap D. Furthermore, the underfill layer 370 surrounds the first conductive elements 340 and the third conductive elements 360, such that the electric connection reliability between the first conductive elements 340 and the third conductive elements 360 can be increased and the short circuit can be avoided.

Moreover, in the present embodiment, since the second substrate 320 is exposed through the gap D between the die 330a and the die 330b, the vertical distance between the die 330a, the die 330b and the first substrate 310 is smaller than the vertical distance between the second substrate 320 exposed through the gap D and the first substrate 310. In the present embodiment, the recessed region 331 can be disposed in the useless region at the back side of the die 330a and the die 330b, such that the second substrate 320 can be disposed in the recessed region 331 to not only provide extra options for the trace of the die 330a and the die 330 and increase the space of signal transformation between the die 330a and the die 330b under the same package structure area and volume but also provide the usage space for the circuit configuration from the die 330a, the die 330b to the first substrate 310, and the second substrate 320, and increase the signal integration ability under the same package structure area and volume.

Specifically, in some embodiments, the third conductive elements 360 may be metal bumps. The material of the third conductive elements 360 may be tin-lead alloy or copper, and the formation method may include plating, or printing.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A package structure, comprising:
   a first substrate having a recessed region;
   a second substrate disposed in the recessed region and protruding from the first substrate;
   a plurality of dies disposed on the first substrate and the second substrate, such that the second substrate is disposed between the first substrate and the dies;
   a plurality of first conductive elements disposed between the dies and the first substrate, wherein the dies are electrically connected to the first substrate through the first conductive elements;
   a plurality of second conductive elements disposed between the dies and the second substrate, wherein the dies are electrically connected to the second substrate through the second conductive elements;
   a first solder mask layer at least disposed on the first substrate in the recessed region, wherein the first solder mask layer has a plurality of first openings;
   a second solder mask layer at least disposed on a bottom surface of the second substrate formed in the recessed region, wherein the first solder mask layer is spaced apart from the second solder mask layer, and the second solder mask layer has a plurality of second openings;
   a third solder mask layer disposed on a top surface of the second substrate opposite to the bottom surface of the second substrate formed in the recessed region; and
   a plurality of third conductive elements electrically connected to the first substrate and the second substrate through the first openings and the second openings.

2. The package structure of claim 1, wherein a height of the first conductive elements is greater than a height of the second conductive elements.

3. The package structure of claim 1, wherein the dies are located at the same horizontal level.

4. The package structure of claim 1, further comprising:
   an underfill layer surrounding the first conductive elements and the second conductive elements and covering the first substrate and the second substrate.

5. The package structure of claim 1, wherein each of the third conductive elements is disposed fully within the recessed region of the first substrate.

6. The package structure of claim 5, wherein each of the third conductive elements is formed as a single element.

7. The package structure of claim 6, wherein when viewed in cross section, the first solder mask layer surrounds an upper part of an outer periphery of the third conductive elements, and the second solder mask layer surrounds a lower part of the outer periphery of the third conductive elements.

8. The package structure of claim 7, wherein the upper part of the outer periphery of each of the third conductive elements is vertically separated from the lower part of the outer periphery of said each of the third conductive elements.

* * * * *